(12) United States Patent
Saxena et al.

(10) Patent No.: US 7,003,742 B2
(45) Date of Patent: Feb. 21, 2006

(54) METHODOLOGY FOR THE OPTIMIZATION OF TESTING AND DIAGNOSIS OF ANALOG AND MIXED SIGNAL ICS AND EMBEDDED CORES

(75) Inventors: Sharad Saxena, Richardson, TX (US); Patrick D. McNamara, San Jose, CA (US); Carlo Guardiani, San Jose, CA (US); Lidia Daldoss, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 328 days.

(21) Appl. No.: 10/339,060

(22) Filed: Jan. 9, 2003

(65) Prior Publication Data

US 2004/0015793 A1 Jan. 22, 2004

Related U.S. Application Data

(60) Provisional application No. 60/347,642, filed on Jan. 10, 2002.

(51) Int. Cl.
*G06F 17/50* (2006.01)

(52) U.S. Cl. .................. 716/3; 716/4; 716/18
(58) Field of Classification Search ................ 716/1–5, 716/18; 703/14, 22
See application file for complete search history.

(56) References Cited

U.S. PATENT DOCUMENTS

| | | | | |
|---|---|---|---|---|
| 6,038,197 A * | 3/2000 | Sitton et al. | ................... | 367/38 |
| 6,259,389 B1 * | 7/2001 | McGrath | ..................... | 341/120 |
| 6,288,776 B1 * | 9/2001 | Cahill et al. | .................. | 356/5.1 |
| 6,374,204 B1 * | 4/2002 | Mandell et al. | ................ | 703/14 |
| 6,506,983 B1 * | 1/2003 | Babb et al. | ............... | 178/18.01 |
| 6,678,319 B1 * | 1/2004 | Jamali | ........................ | 375/234 |

OTHER PUBLICATIONS

Why is experimental design important for process modeling?, Engineering Statistics Handbook, pp 1-5; www:itl.nist.gov/div898/handbook/pmd/section3/pmd32.htm, Dec. 6, 2002.
What are some general design principles for process modeling?, Engineering Statistics Handbook, pp 1-5, www:itl.nist.gov/div898/handbook/pmd/section3/pmd33.htm, Dec. 6, 2002.
Wu, Cheng-Wen, Lab for Reliable Computing (LaRC),EE, NTHU, 2002, Chapter 1, Introduction, pp 1-17.
Gifford, David, Computational functional genomics, (Spring 2001; Lecture 9), pp 1-20.
Neddermeijer et al., A Framework for Response Surface Methodology for Simulation Optimization, Proceedings of the 2000 Winter Simulation Conference, pp 1-8.
Chemometrics, Unit 4, Response Surface Methodology, date unknown.

* cited by examiner

*Primary Examiner*—Paul Dinh
(74) *Attorney, Agent, or Firm*—Duane Morris LLP; Steven E. Koffs

(57) ABSTRACT

A method for analyzing an integrated circuit (IC) having at least one of the group consisting of digital and analog components, where the IC is designed to meet a plurality of circuit performance specifications, and fabrication of the IC is monitored by measuring process factors and a previously defined set of electrical test variables. A set of linearly independent electrical test parameters are formed based on a subset of the set of electrical test variables. The set of process factors is mapped to the linearly independent electrical test parameters. A plurality of figure-of-merit (FOM) performance models are formed based on the process factors. The FOM models are combined with the mapping to enable modeling of IC performance based on the linearly independent electrical test parameters.

14 Claims, 3 Drawing Sheets

METHODOLOGY FOR THE OPTIMIZATION OF TESTING AND DIAGNOSIS OF ANALOG AND MIXED SIGNAL ICS AND EMBEDDED CORES

This application claims the benefit of U.S. Provisional Patent Application No. 60/347,642, filed Jan. 10, 2002.

FIELD OF THE INVENTION

The present invention pertains to the optimization of the performance and manufacturability of integrated circuits.

BACKGROUND

The continuous development of complex applications which incorporate analog and digital components on a single chip, together with the rapid growth of the integration level and the remarkable impact of process variability on modern technologies contribute to increase the sensitivity of circuit performance to the inherent fluctuations of the fabrication process parameters. The combined action of these components leads to an increased spread in the performance of VLSI circuits and, thus, significant parametric yield losses.

Therefore parametric faults, which result from global variations in manufacturing, are becoming more important for mixed signal IC blocks as well as their detection, particularly during the early stages of the development process. Unlike the case for digital circuits where efficient design for testability techniques have been developed to increase signal controllability and the detection of internal nodes, analog circuits still require long production testing time and expensive test equipment in order to verify all circuit specifications. Furthermore, the low sensitivity to the internal signal of analog component nodes makes it more difficult to diagnose faulty circuits or measure the functions of embedded components. As a matter of fact, these problems cannot be solved by simply introducing additional circuitry to achieve controllability and the detection capability of analog nodes, since this can significantly perturb their impedance and affect the performance of the block under test.

Another simplification of digital compared to analog testing is the availability of easy fault models such as "stuck at" faults, which stem from the dominance of short and opens mechanisms. In mixed signal applications, parametric faults are at least as important as random and systematic defects, therefore simplified models for the detection of catastrophic faults cannot be applied. Finally, digital test program development can be automated with the support of Automatic Test Pattern Generators (ATPG) and verified with software and hardware description of the circuit before the first silicon is available. However, analog test development still requires manual optimization steps and an efficient synergic interaction between the design, process and test development teams. Consequently, the delay in the availability of prototypes and the lack of automation for analog test program development can strongly penalize the time to market and affect investments returns. Therefore, the need for efficient testing methods for mixed signal embedded IC components with respect to parametric faults increases, however an exhaustive functional testing results in an extremely expensive procedure.

Parametric variations are the major concern for testing analog and mixed signal integrated circuits (Ics) and embedded components, because they are likely to occur and harder to detect. Therefore, parametric testing of analog and mixed signal circuits is a topic of growing interest. Different approaches have been proposed to (i) minimize testing time by optimally reordering the process control monitor electrical test (PCM/e-test) measurements, (ii) drop functional tests without degrading fault coverage, (iii) identify optimal test sets for ICs and (iv) to evaluate their effectiveness.

L. Milor and A. Sangiovanni Vincentelli "Minimizing production test time to detect faults in analog circuits" in IEEE Trans. CAD, June 1994, falls in the first category since essentially heuristic approaches to test ordering have been proposed. The easiest way to reduce the number of e-tests in a test set is to drop the tests that are never failed [1], however it is necessary to reach a tradeoff between achieving minimal production testing time and maximizing failure information. A large number of papers have tried to adopt a limited set of measurements to predict the results of other measurements, by applying different strategies such as QR factorization [2], singular value decomposition [3], testing of all small subsets of measurements for dependency [4], or selecting measurements based on sensitivity information [5]. These procedures geometrically defined in the space of measurements, or in the space of the statistical SPICE parameters, do not consider circuit specifications. Therefore, e-tests are typically designed to guarantee the range of device parameter variation described by the SPICE corner models rather than considering their statistical correlation with the circuit performance targets.

W. Lindermeir et al., "Analog testing by Characteristic Observation Inference", IEEE Trans. on CAD, September 1999, suggest that the satisfaction of the specifications can be inferred directly from the measurements. However, their validation criteria exploits posterior probabilities extracted from a training data set, to classify the circuit with respect to one given specification.

K. Kibarian et al. in "Analysis of Mixed-Signal Manufacturability with Statistical Technology CAD (TCAD)", IEEE Trans. on Semiconductor Manufacturing", 1996, deals with the introduction of additional e-test or in-line measurements based on a matching algorithm between measurements and process factors, but without considering circuit specifications compliance.

The following documents are incorporated by reference herein in their entireties:

[1] L. Milor and A. Sangiovanni-Vincentelli, "Minimizing Production Test Time to Detect Faults in Analog Circuits", IEEE Trans. on CAD of ICs and Systems, June 1994, pp. 796–813

[2] G. N. Stenbakken et al., "Test-point selection and testability measures via QR factorization of linear models", IEEE Trans. Instrum. Measur., Volume: 36, pp. 406–410, June 1987.

[3] E. Liu et al.,Analog Testability analysis and fault diagnosis using behavioral modeling, Proc. CICC, pp. 413–416, 1994.

[4] G. N. Stenbakken et al., Ambiguity Groups and Testability, IEEE Trans. Instrum. Measur., Volume: 38, pp. 941–947, October 1989.

[5] G. J. Heminket al., Testability analysis of analog system, IEEE Trans. Computer-Aided Design, Volume: 9, pp. 573–583, June 1990.

SUMMARY OF THE INVENTION

A method for analyzing an integrated circuit (IC) having at least one of the group consisting of digital and analog components, where the IC is designed to meet a plurality of circuit performance specifications, and fabrication of the IC is monitored by measuring process factors and a previously defined set of electrical test variables. A set of linearly independent electrical test parameters are formed based on a subset of the set of electrical test variables. The set of process factors is mapped to the linearly independent electrical test parameters. A plurality of figure-of-merit (FOM) performance models are formed based on the process factors. The FOM models are combined with the mapping to enable modeling of IC performance based on the linearly independent electrical test parameters.

OVERVIEW

Figure 1:
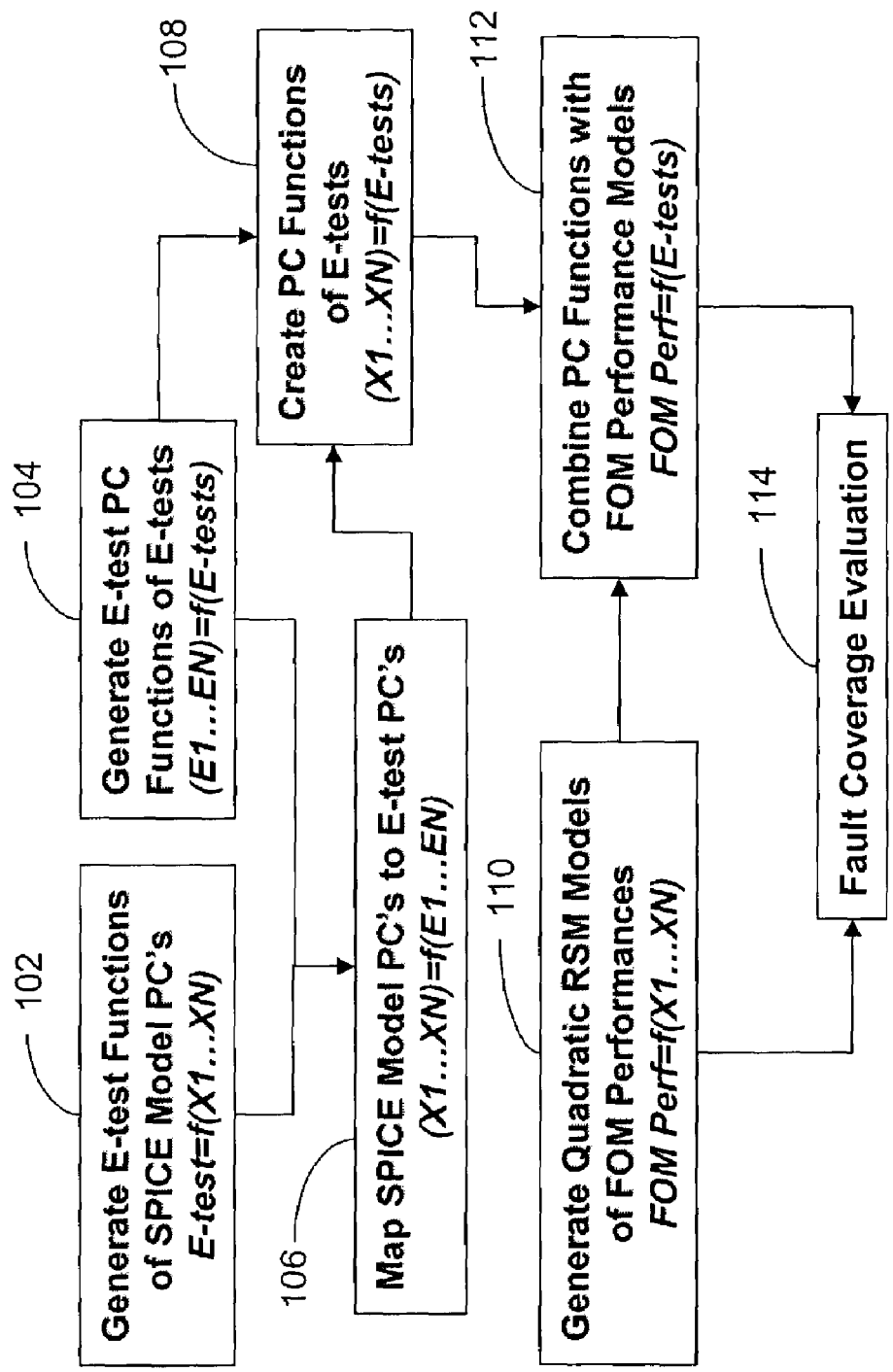
FIG. 1 is a flow chart diagram showing the overall methodology of an exemplary embodiment of the invention.

U.S. Provisional Patent Application No. 60/347,642, filed Jan. 10, 2002 is incorporated by reference herein in its entirety.

An exemplary methodology estimates and improves the quality of analog and mixed signal circuit testing. The exemplary method allows one to assess and optimize the effectiveness of an existing set of Process Control Monitor (PCM) and electrical test (e-test) measurements in order to detect parametric failures involving one or more performance specifications of Integrated Circuits (IC) or IC components. There are several aspects of IC test and yield optimization that are addressed by the exemplary method, including the elimination of redundant PCMs, the accurate assessment of the parametric fault coverage of embedded analog blocks and the selection of additional measurements for 100% test coverage. In one preferred embodiment, a clustering procedure to remove highly correlated e-tests is first carried out before applying statistical and numerical techniques to further reduce the number of measurements. Then, the availability of circuit performance models and e-test models as functions of process factors is used to create a PCM based model for each circuit performance specification of interest. In this way, an accurate metric can be defined to compute the parametric fault coverage given by a set of PCMs, assuming that the underlying statistical device models can capture all the relevant process variability.

Some preferred embodiments of the present invention provide an accurate assessment of all the relevant parameters, leading to an efficient optimization of the quality of analog and mixed signal circuit testing.

A methodology is described herein to replace expensive parametric tests of embedded Analog and Mixed Signal IC blocks with simple non-redundant e-test measurements. The method allows for the elimination of redundancy in the e-test space, by identifying a reduced number of (independent combinations of) the existing e-tests, which covers the same variability as the original measurements. The automatic generation of accurate performance macromodels as a function of e-tests can be carried out empirically in a statistical simulation environment by considering circuit specifications as well as process parameters distributions. The evaluation of these linear/quadratic models is mandatory for the classification of circuits and the detection of parametric faults, directly mapped in the space of circuit performance variables. The exemplary method focuses on the determination of which portion of the process parameters variability space, identified by means of the circuit performance constraints, is actually "observed" by the selected set of e-tests. This region defines the test coverage corresponding to an existing set of e-tests. However, accurate assessment of the parametric fault coverage and the parametric yield coverage metrics includes comparing the simulated performance values obtained by using the entire space of the statistical parameters and the subset of process factors actually monitored by a specific set of e-tests. If statistical circuit simulation is used, a latent variables analysis can be applied to identify missing e-tests based on statistical significance tests and performance sensitivity information. The method can be then iteratively re-applied until full coverage is obtained.

The exemplary embodiment of the invention described herein reduces redundancy in the e-test space, and detects the lack of testability while complementing the existing set of measurements with additional e-tests until a satisfactory test coverage is obtained.

The exemplary methodology described herein addresses the issue of analog testability by using statistical models of embedded analog core performance parameters as functions of a set of simple electrical measurements. First we remove the redundancy in the e-test measurements by using a set of well known statistical techniques such as Principal Component Analysis (PCA), and then we propose an efficient technique to assess and improve the quality of test coverage achieved by a given set of e-tests.

A parametric fault modeling strongly correlated to specification-based test procedures has been performed, and performance macro models as functions of independent e-tests have been generated. We assume that a circuit fault occurs if at least one of the performance constraints is violated and as in the work of W. Lindermeir et al., "Analog testing by Characteristic Observation Inference", IEEE Trans. on CAD, September 1999, the satisfaction of the specifications can be inferred directly from the measurements. However, their validation criteria exploits posterior probabilities extracted from a training data set, to classify the circuit with respect to one given specification, while our methodology allows for the direct verification of the performance parameters by simply evaluating the quadratic performance macro models. Nevertheless, the generation of accurate SPICE models based on e-test measurements (E models), and their use in the simulation of circuit applications, is also provided for in our complete flow.

Finally, an accurate metric is described below to effectively estimate the quality of test coverage achieved by the selected e-tests relative to a predefined set of analog core performance targets. However, we locate the performance values in the variability space, and thus we automatically verify their inclusion within the acceptability region/hyperspace defined by the performance specifications. When the set of process factors describes the entire variability of the performance parameters, we assume that the performance values obtained by simulating the statistical SPICE models based on process factors (X models), represents the real case. Therefore, the test coverage can be estimated as the ratio between the number of cases where both the E and X models identify a faulty (good) circuit over the total number of runs.

Further, if statistical circuit simulation is used, an iterative procedure can be applied to identify missing e-tests based on statistical significance tests, performance sensitivity information and, obviously, designer's experience. The missing variables are directly related to physical measurements that can be generated and added to the current e-test subset. In this context, the present methodology extends the objective of K. Kibarian et al. in "Analysis of Mixed-Signal Manufacturability with Statistical Technology CAD (TCAD)", IEEE Trans. On Semiconductor Manufacturing", 1996.

Figure 2:
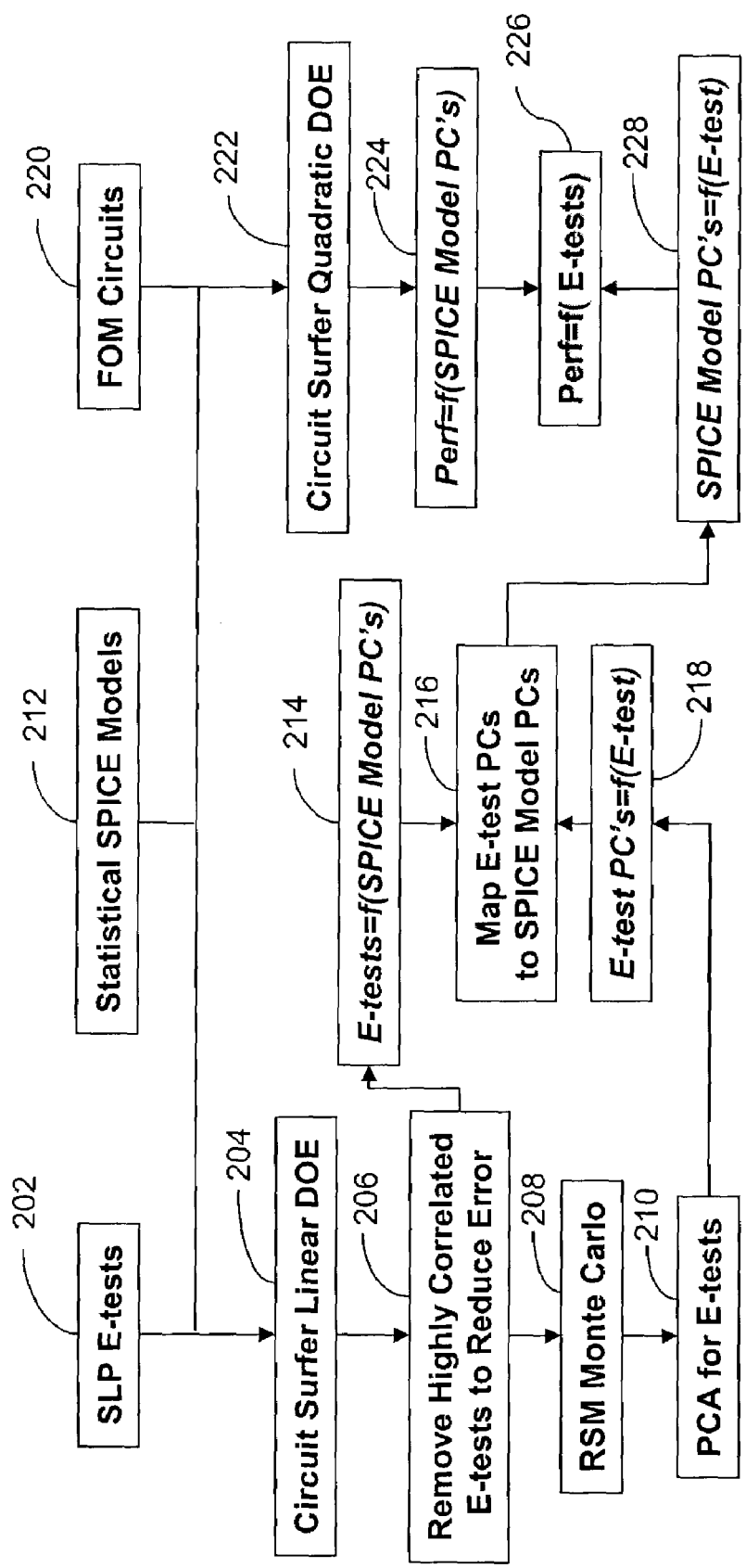
FIG. 2 is a more detailed flow chart diagram of the exemplary method.

In order to facilitate the understanding of the innovative contributions of this work, we construct both simplified and detailed representations of the methodology sequences to extract circuit performance models as a function of e-tests, in FIG. 1 and FIG. 2, respectively. The detailed description is provided below. A simple representation of the circuit performance space for a single parameter is included. The circles and the squares represent the performance values obtained with X and E models, respectively, while the shadowed area indicates the acceptability region of the circuit performances. Test coverage can be defined considering the percentage of cases where both of the symbols fall outside or within the acceptability region.

DETAILED DESCRIPTION OF THE INVENTION

Three aspects of the exemplary embodiment are as follows. First, we detect and reduce redundancy in a selected set of e-test measurements. Second, we provide a direct mapping between the e-test space and the circuit performance domain. Finally, we use an efficient technique for the accurate evaluation of the fault coverage, guaranteed by the existing set of measurements.

In an exemplary method for analyzing an integrated circuit (IC) having digital or analog components, the IC is designed to meet a plurality of circuit performance specifications, and fabrication of the IC is monitored by measuring process factors and a previously defined set of electrical test variables. At least two of the set of electrical test variables that that are highly correlated with each other are detected. A subset of the set of electrical test variables is formed, excluding from the subset at least one of the detected variables. The subset of electrical tests is transformed by a principle component transformation to a set of linearly independent principle components. The set of process factors are mapped to the linearly independent electrical test parameters. A plurality of figure-of-merit (FOM) performance response surface methodology (RSM) models are formed based on the process factors. The FOM models are combined with the mapping to enable modeling of IC performance based on the linearly independent electrical test parameters.

In some embodiments, a plurality of different designs of experiment (DOE) are selected based on respective combinations of the process factors. A respective response FOM model is generated for each DOE. The sensitivity of circuit performance to each of the process factors is analyzed. At least one additional electrical test is added to the set of electrical test variables, based on the sensitivity analysis. Then, the steps of detecting correlated electrical test variables, forming a subset of the test variables excluding one of the correlated variables, transforming the subset to linearly independent principle components, and mapping the process factors to the linearly independent principle components are reiterated.

The following steps are performed, as described below:
Perform linear DOE on e-tests
Select a representative set of e-tests accordingly to a correlation-based clustering
Extract response surface methodology (RSM) models of the reduced set of e-tests
Apply PCA to the dataset to generate e-test PCs
Map process factors to e-test PCs
Create figure of merit (FOM) performance RSM models via quadratic DOE as a function of process factors
Derive performance models as a function of e-tests
Evaluate fault coverage and yield coverage metrics The simplified and detailed representations of the methodology flow are depicted in FIG. 1 and FIG. 2, respectively, while the detailed description of each single step is described in the following sections.

1. E-test Redundancy Reduction and Performance Models Generation

Assume that the analog embedded block to be tested is composed of a finite number of sub-circuits, $(c_i, i=1, \ldots, Nc)$ and that each of the design sub-circuits can be accurately simulated with SPICE. Examples of analog cores and associated sub-circuits are shown in Table I.

TABLE I

Analog core examples

| ANALOG CORE | SUB_CIRCUITS | PERFORMANCE |
| --- | --- | --- |
| PLL | Phase Detector | resolution, speed |
|  | Loop Filter | phase noise, linearity |
|  | VCO | phase noise, tuning range, linearity |
| Flash A/D | Voltage Reference | stability |
|  | Comparators | speed |
|  | Decoder | speed |

The sub-system functionality is completely specified in terms of a set of performance parameters $(y_j, j=1, \ldots, Ny)$ and each of the them can be accurately estimated by simulating one of the sub-blocks. Examples of such performance parameters are also shown in Table I.

Define ml, l=1, . . . ,Nm the set of PCM data that are measured at wafer or die sort. Each e-test can also be accurately simulated by using SPICE. An example of typical analog test monitors is shown in Table II. Finally, the methodology assumes that the entire variability of the manufacturing process can be captured by using a set of independent random parameters, $X_k$, k=1, . . . ,$N_x$, called the process factors.

TABLE II

Typical test monitors for MOSFETs and BJTs

| ELEMENT TYPE | TEST MONITOR |
| --- | --- |
| MOSFET | $V_{th}$ |
|  | $I_{dsat}$ |
|  | $g_m$ |
|  | $g_o$ |
| BJT | Hfe |
|  | $V_{be}$ |
|  | $R_{bb}$ |

The relation between the electrical characteristics of transistors and passive components, including wiring parasitics, and the process factors, is accurately captured by generalized statistical SPICE models, which express all the relevant functional and statistical dependence between every SPICE model parameter and a subset of process factors, also including parameter to parameter and intra-die correlation information. In addition to traditional statistical SPICE models, the process factors account for back end of line variations, such as metal layer critical dimension (CD) or thickness, dielectrics thickness, etc . . .

The first step of our method is to use Response Surface Methodology (RSM) and SPICE to create low order, multivariant polynomial models of every circuit performance parameter $y_j$ and every PCM measurement $m_l$ as functions of the process factors, namely:

$$y_j = y_j(x_1, \ldots, x_{N_x}), j=1, \ldots, N_y$$

$$m_l = m_l(x_1, \ldots, x_{N_x}), l=1, \ldots, N_m$$

The observed variations of the PCM/e-test measurements $m_l$ can be used to predict the variability in the circuit performance parameters $y_j$. However, the PCM/e-test measurements are not linearly independent, hence some of them are partially redundant statistical estimators of the circuit performance variability. Moreover, some of the circuit performance parameters may be sensitive to the variation of process factors that is not actually sensitized by any of the current measurements.

In order to solve the first issue, the e-test set is analyzed via DOE to determine the most significant measurements. Highly correlated e-tests can be removed to maximize accuracy in models, as a matter of fact redundant e-tests create noise in modeling. Then, we apply a Principal Component Transformation to the PCM/e-test variables, i.e. an orthogonal transformation in order to obtain new variables, called Principal Components (PCE) in the e-test space, which are linearly independent and describe the same variance of the original e-tests. By assuming a linear relationship between e-tests and process factors and knowing the mapping between PCEs and e-tests, it is possible to replace the process factors with an appropriate combination of E-test PC's.

This process includes the application of different numerical algorithms such as QR decomposition, singular value decomposition, LU factorization, in order to implement the methodology still preserving accuracy. On the other hand, circuit performance targets can be expressed as a function of process factors by means of a quadratic DOE as well as E-test PCs, as mentioned above, therefore, PCE functions can be combined with process factor-based performance models (X) to obtain a PCM-based model (E) for each performance.

Two different methods are implemented forevaluating the performance statistics. In the simplest one, the previous relationships are first combined to obtain the linear/quadratic performance macromodels as a function of independent e-tests, namely:

$$y_j = y_j(e_1, \ldots, e_{N_e}), j=1, \ldots, N_y$$

Thus, the statistical characterization of the performance can be carried out by simply plugging into the models the values of the e-test measurements. The availability of these macromodels allows for the delineation if the circuit performance values, associated with a generic set of e-tests, fall in the acceptability region or not. Therefore, faulty circuits can be discarded on the basis of this criterion.

Another approach to estimate circuit performance data includes re-simulating circuits by using E models, instead of X models. However, this verification can be cumbersome from the computational standpoint, since it includes running an Experimental Design with as many independent variables as the global number of e-tests associated with all the devices included in the circuit. However, an appropriate screening of the input variables can be done, simply (i) running a simplified DOE and examining the sensitivity of the circuit performance functions with respect to different e-tests or (ii) considering the normalized values of the coefficients present in the macromodels.

2. Parametric Test Coverage Assessment

Fault coverage for analog circuits cannot be restricted to potential shorts and opens which can be easily detected by a test, since parametric faults, spanning a continuous range of circuit element variations, are likely to occur and also harder to detect. Moreover, discarding a circuit due to an 'out-of-range' element value that actually does not threaten specification compliance, can significantly reduce yield. Therefore, only a statistically-based definition of the Figures of Merit of the circuit (FOMs) in terms of e-test measurements can provide an accurate analog test metric. The performance constraints are usually coincident with the specifications for the application to be developed. Therefore circuits that do not meet the performance requirements are considered as faulty and then discarded.

In order to provide an accurate assessment of the parametric fault coverage offered by a set of e-test measurements, we desire the real measurements of the circuit performances. Nevertheless, if the set of process factors describes the entire variability of the performance parameters, it is realistic to assume that the performance values obtained by simulating the X models represent the real case.

Figure 3:
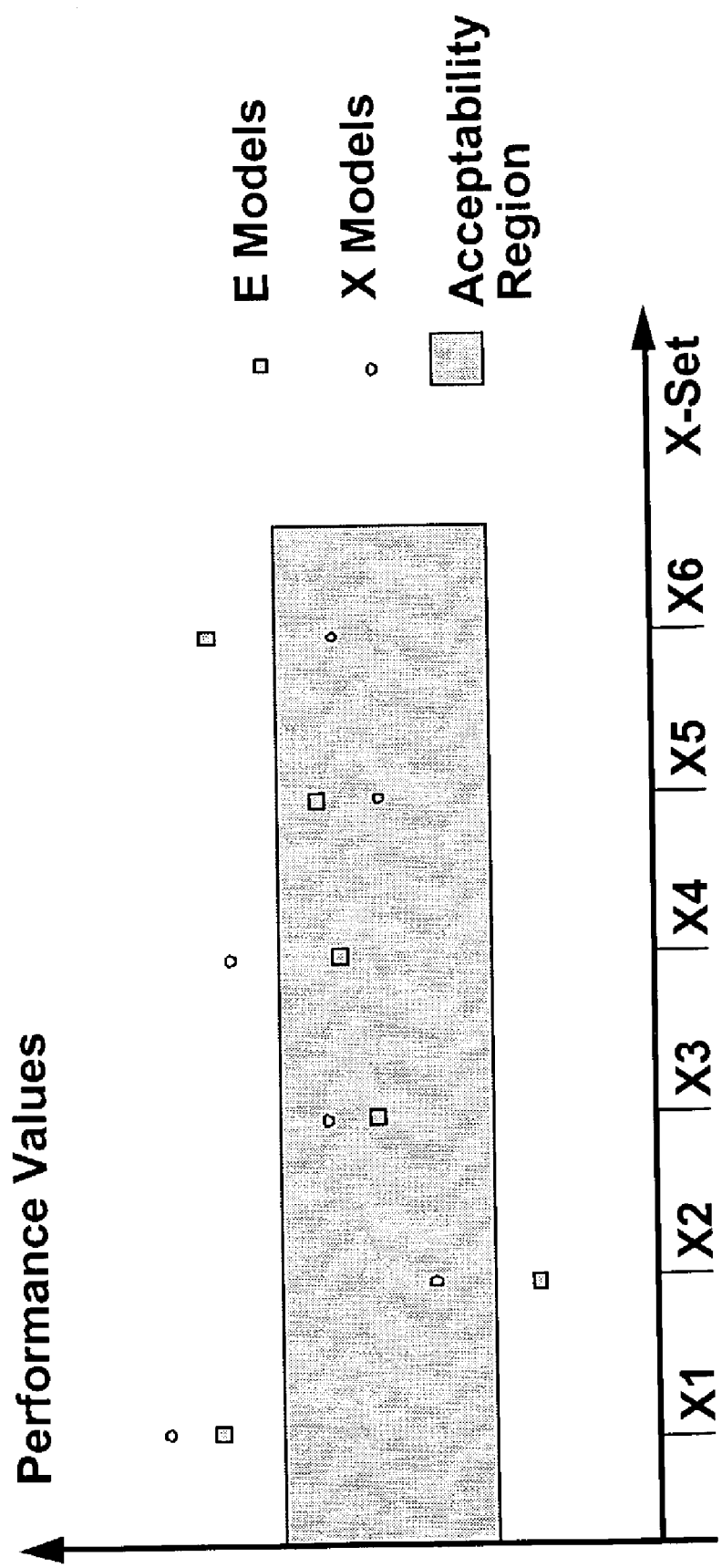
FIG. 3 is graph showing a circuit performance space.

The definition of the test coverage metric can be easily interpreted by looking at the diagram depicted in FIG. 3. The circles and the squares represent the performance values obtained with X and E models, respectively, while the shadowed area indicates the acceptability region (AR) of the circuit performances.

There are four different cases:
(a) Both X and E belong to AR.
(b) Neither X nor E belong to AR.
(c) X, but not E belongs to AR.
(d) E, but not X belongs to AR.

The test coverage can be defined as the ratio between the number of runs where both X and E models fall outside/in the acceptability region over the total number of runs. As a matter of fact, in case (a), a circuit which operates correctly is retained, while in case (b), a faulty circuit is rejected.

The exemplary methodology has been supported by the Circuit Surfer statistical simulation and optimization environment and completely automated by means of Matlab routines. The availability of a powerful tool such as Circuit Surfer, provides the capability to run different designs of experiment (DOE) over the process factors space to characterize circuit FOMs and e-test measurements, generating their response surface models as a function of the independent variables included in the statistical SPICE models. Moreover, the correlation information of the simulated e-tests, provided by Circuit Surfer, is a key-factor for the identification of redundancy in the measurements space whereas sensitivity data can be exploited to track down the dominant process factors for each circuit FOM. The generation of the performance models as function of independent combinations of e-test measurements has been performed in the Matlab environment and completely automated through appropriate routines. The evaluation of the prediction capability of the obtained models by plugging in real SLP measurements (electrical measurements taken from the scribeline, or SL, structures.)has been implemented with Perl scripts.

FIG. 1 shows a general summary of an exemplary method.

At step 102, a plurality of electrical test (e-test) functions of SPICE models are generated. These e-test functions as expressed as functions of the process factor-based performance models (X).

At step 104, a plurality of E-test principal components (PCs) are determined, as transformed values of the e-tests. The E-test PCs are linearly independent and describe the same variance as the original e-tests.

At step 106, the SPICE model functions of the process factor-based performance models (X) are mapped to the E-test PC's.

At step 108, the PC functions of E-tests are formed, to map the process factor-based performance models (X) to the e-tests.

At step 110, a plurality of quadratic response surface methodology (RSM) figure of merit (FOM) performance models of circuit performance are generated, based on the process factors.

At step 112, the PC functions of step 108 are combined with the FOM performance models of step 110, to provide a plurality of FOM performance models as a function of the e-tests.

At step 114, results from the E-test models and X models are combined to make a fault coverage assessment. A latent variables analysis can be applied to identify missing e-tests based on statistical significance tests and performance sensitivity information.

FIG. 2 shows a more detailed summary of an example.

At block 202, a plurality of e-test measurement data are provided as inputs to the method.

At block 212, a plurality of statistical SPICE models are provided as inputs to the method. The SPICE models relate performance to process factors.

At block 220, a plurality of FOM Circuit performance models are provided using RSM models.

At step 204, a tool such as Circuit Surfer, is used to run different designs of experiment (DOE) over the process factors space to characterize circuit FOMs and e-test measurements.

At step 206, highly correlated e-tests are identified (e.g., through a clustering procedure) and redundant tests are removed to reduce error.

At step 208, a Monte Carlo experiment is performed.

At step 210, a principal component analysis is performed to generate the E-test principal components.

At block 214, upon elimination of highly correlated (redundant) e-tests, the E-tests are mapped to SPICE model principal (X) components.

At block 218, the E-test PC's are mapped to functions of e-tests.

At step 216, the E-test PCs (block 218) are mapped to SPICE model (X) PCs from block 214. The results (block 228) are available for performance determination as a result of the e-test data.

At step 222, a tool such as Circuit Surfer is used for quadratic DOE as a function of process factors.

At step 224, the FOM performance models are formed using the SPICE (X) models based on process factors.

At step 226, the FOM performance models are mapped to the e-test PCs.

APPLICATION EXAMPLES

The present methodology has been applied to a BiCMOS process with minimum feature size of 0.25 μm, however its applicability can be easily extended to any type of process.

After obtaining RSM of the e-tests, it has been possible to replace each initial process factors with a linear combination of independent e-tests in the SPICE models.

In order to verify the validity of the methodology, the e-tests are re-simulated by exploiting E models. The comparison of the e-test statistics by using X models and E models has been done on the basis of a Monte Carlo experiment with 1000 samples.

TABLE III

Comparison of e-tests statistics

|  | MEAN | STDEV |
| --- | --- | --- |
| E-test 1 | 0.23% | 0.42% |
| E-test 2 | 0.11% | −2.00% |
| E-test 3 | 0.16% | −2.24% |
| E-test 4 | 0.22% | −3.75% |
| E-test 5 | 0.10% | −1.70% |
| E-test 6 | 0.08% | −2.11% |
| E-test 7 | 0.11% | −1.98% |
| E-test 8 | 0.15% | −2.23% |
| E-test 9 | 0.23% | −3.71% |
| E-test 10 | 0.10% | −1.69% |
| E-test 11 | 0.08% | −2.10% |
| E-test 12 | 0.00% | −5.14% |
| E-test 13 | 0.00% | −3.82% |

Table III reports the percentage error on mean and standard deviation for these two different models. Results confirm that process factors can be replaced by a non-redundant set of e-tests without losing information in terms of the variability of the e-test themselves. For the FOM's evaluation, a DOE is first applied in order to obtain a quadratic RSM of the performance as a function of process factors. Then a 10,000 sample Monte Carlo experiment is implemented. The simulation of the e-tests by using the same process factors allows for the extraction of the relationship and the replacement of the Xs with a linear combination of the Es in the original RSMs. This procedure provides quadratic models of circuit performance as a function of independent e-tests The comparison of the performance statistics is summarized in Table II. Finally, the parametric test coverage evaluation has been applied by imposing an acceptable variation of 3 sigma on the FOMs and the results are reported in Table V.

TABLE IV

Comparison of circuit performance statistics

| CKT/PERF | MODEL | MEAN | STDEV | ERR. MEAN | ERR. STD DEV |
| --- | --- | --- | --- | --- | --- |
| LNA_GAIN | X-mod | 18.73 | 0.56 | −0.02% | −1.47% |
|  | E-mod | 18.726 | 0.551 |  |  |
| LNA_IIP3 | X-mod | −10.2 | 0.833 | 0.01% | −1.97% |
|  | E-mod | −10.201 | 0.815 |  |  |
| LNA_NF | X-mod | 0.8935 | 0.043 | −0.05% | −1.19% |
|  | E-mod | 0.8931 | 0.042 |  |  |
| MIX_GAIN | X-mod | 8.823 | 0.1236 | 0.03% | −3.21% |
|  | E-mod | 8.825 | 0.1197 |  |  |
| MIXER_IIP3 | X-mod | −5.428 | 0.4069 | 0.06% | −0.13% |
|  | E-mod | −5.431 | 0.4063 |  |  |
| DRV_GAIN | X-mod | 12.75 | 0.0493 | −0.03% | 0.65% |
|  | E-mod | 12.745 | 0.0496 |  |  |
| DRV_OIP3 | X-mod | 27.9 | 0.8377 | −0.01% | −0.60% |
|  | E-mod | 27.89 | 0.8332 |  |  |
| VCO_PN50K | X-mod | −95.57 | 0.1527 | 0.00% | 0.39% |
|  | E-mod | −95.57 | 0.1533 |  |  |

TABLE IV-continued

Comparison of circuit performance statistics

| CKT/PERF | MODEL | MEAN | STDEV | ERR. MEAN | ERR. STD DEV |
|---|---|---|---|---|---|
| VCO_PN1M | X-mod | −121.8 | 0.1566 | 0.03% | 0.34% |
|  | E-mod | −121.83 | 0.1571 |  |  |

TABLE V

Parametric Test Coverage

| CKT/PERF | FAULT COVERAGE |
|---|---|
| LNA_GAIN | 98.9% |
| LNA_IIP3 | 99.6% |
| LNA_NF | 98.8% |
| MIX_GAIN | 99.1% |
| MIX_IIP3 | 98.6% |
| DRV_GAIN | 99.3% |
| DRV_OIP3 | 99% |
| VCO_PN50k | 99.5% |
| VCO_PN1M | 99.3% |

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for analyzing an integrated circuit (IC) having at least one of the group consisting of digital and analog components, wherein the IC is designed to meet a plurality of circuit performance specifications, and fabrication of the IC is monitored by measuring a set of process monitor variables and a previously defined set of electrical test variables, the method comprising the steps of:
   (a) forming a set of linearly independent electrical test parameters based on a subset of the set of electrical test variables and the process monitor variables;
   (b) mapping the set of process monitor variables to the linearly independent electrical test parameters;
   (c) forming a plurality of figure-of-merit (FOM) performance models based on the set of process monitor variables; and
   (d) combining the FOM models with the mapping to enable modeling of IC performance based on the linearly independent electrical test parameters.

2. The method of claim 1, wherein step (a) includes:
   (i) detecting at least two of the set of electrical test variables that provide redundant information;
   (ii) forming a subset of the set of electrical test variables, excluding at least one of the detected variables from the subset;
   (iii) transforming the subset of the set of electrical test variables to a set of linearly independent principle components.

3. The method of claim 2, wherein the detecting step includes detecting at least two of the set of electrical test variables that are highly correlated with each other.

4. The method of claim 2, wherein step (iii) includes performing a principle component transformation.

5. The method of claim 4, wherein the principle component transformation includes at least one of the group consisting of QR decomposition, singular value decomposition and LU factorization.

6. The method of claim 1, wherein the FOM models are response surface methodology models.

7. The method of claim 1, wherein the FOM models include at least one of the group consisting of quadratic performance models and linear performance models.

8. The method of claim 1, further comprising:
   selecting a plurality of different designs of experiment (DOE) based on respective combinations of the process monitor variables;
   generating a respective response FOM model for each DOE; and
   analyzing sensitivity of circuit performance to each of the process monitor variables.

9. The method of claim 8, further comprising:
   adding at least one additional electrical test to the set of electrical test variables, based on the sensitivity analysis.

10. The method of claim 9, further comprising repeating steps (a) through (d).

11. A method for analyzing an integrated circuit (IC) having digital and analog components, wherein the IC is designed to meet a plurality of circuit performance specifications, and fabrication of the IC is monitored by measuring a set of process monitor variables and a previously defined set of electrical test variables, the method comprising the steps of:
   (a) detecting at least two of the set of electrical test variables that that are highly correlated with each other;
   (b) forming a subset of the set of electrical test variables, excluding at least one of the detected variables from the subset;
   (c) transforming the subset of the set of electrical test variables by a principle component transformation to a set of linearly independent principle components;
   (d) mapping the set of process monitor variables to the set of linearly independent principle components;
   (e) forming a plurality of figure-of-merit (FOM) performance response surface methodology models based on the process monitor variables; and
   (f) combining the FOM models with the mapping to enable modeling of IC performance based on the set of linearly independent principle components.

12. The method of claim 11, further comprising:
   selecting a plurality of different designs of experiment (DOE) based on respective combinations of the set of process monitor variables;
   generating a respective response FOM model for each DOE; and
   analyzing sensitivity of circuit performance to each of the set of process monitor variables.

13. The method of claim 12, further comprising:
   adding at least one additional electrical test to the set of electrical test variables, based on the sensitivity analysis.

14. The method of claim 13, further comprising repeating steps (a) through (d).

* * * * *